United States Patent
Horiuchi

(10) Patent No.: US 9,893,208 B2
(45) Date of Patent: Feb. 13, 2018

(54) NONVOLATILE MEMORY DEVICE

(71) Applicant: NSCORE, INC., Fukuoka-shi, Fukuoka (JP)

(72) Inventor: Tadahiko Horiuchi, Isehara (JP)

(73) Assignee: NSCORE, INC., Fukuoka-shi, Fukuoka (JP)

( * ) Notice: Subject to any disclaimer, the term of this patent is extended or adjusted under 35 U.S.C. 154(b) by 0 days.

(21) Appl. No.: 15/592,588

(22) Filed: May 11, 2017

(65) Prior Publication Data

US 2017/0250292 A1    Aug. 31, 2017

Related U.S. Application Data

(63) Continuation of application No. 15/047,759, filed on Feb. 19, 2016.

(51) Int. Cl.

| | | |
|---|---|---|
| G11C 16/04 | (2006.01) | |
| H01L 29/792 | (2006.01) | |
| H01L 29/08 | (2006.01) | |
| H01L 29/47 | (2006.01) | |
| H01L 29/78 | (2006.01) | |
| H01L 29/66 | (2006.01) | |
| G11C 11/419 | (2006.01) | |
| G11C 11/418 | (2006.01) | |

(52) U.S. Cl.
CPC .......... *H01L 29/792* (2013.01); *G11C 11/418* (2013.01); *G11C 11/419* (2013.01); *H01L 29/0847* (2013.01); *H01L 29/47* (2013.01); *H01L 29/66492* (2013.01); *H01L 29/66833* (2013.01); *H01L 29/7835* (2013.01); *H01L 29/7839* (2013.01)

(58) Field of Classification Search
USPC .......... 365/185.18, 185.05, 185.25; 257/190, 257/347, 288, 408
See application file for complete search history.

(56) References Cited

U.S. PATENT DOCUMENTS

| | | |
|---|---|---|
| 3,636,530 A | 1/1972 | Mark et al. |
| 4,419,744 A | 12/1983 | Rutter |
| 5,768,192 A | 6/1998 | Eitan |

(Continued)

FOREIGN PATENT DOCUMENTS

| | | |
|---|---|---|
| JP | H06-076582 A | 3/1994 |
| JP | H06-231587 A | 8/1994 |

(Continued)

*Primary Examiner* — Vu Le
(74) *Attorney, Agent, or Firm* — Hauptman Ham, LLP

(57) ABSTRACT

A nonvolatile memory cell includes a first-conductivity-type silicon substrate, a metal layer formed in a surface of the first-conductivity-type silicon substrate, a second-conductivity-type diffusion layer formed in the surface of the first-conductivity-type silicon substrate and spaced apart from the metal layer, an insulating film disposed on the surface of the first-conductivity-type silicon substrate between the metal layer and the second-conductivity-type diffusion layer, a gate electrode disposed on the insulating film between the metal layer and the second-conductivity-type diffusion layer, and a sidewall disposed at a same side of the gate electrode as the metal layer and situated between the gate electrode and the metal layer, the sidewall being made of insulating material.

8 Claims, 9 Drawing Sheets

(56) References Cited

U.S. PATENT DOCUMENTS

| | | |
|---|---|---|
| 5,956,269 A | 9/1999 | Ouyang et al. |
| 6,038,168 A | 3/2000 | Allen et al. |
| 6,064,590 A | 5/2000 | Han et al. |
| 6,282,145 B1 * | 8/2001 | Tran .................... G11C 11/5621 |
| | | 365/230.06 |
| 6,335,554 B1 | 1/2002 | Yoshikawa |
| 6,642,586 B2 | 11/2003 | Takahashi |
| 6,740,927 B1 | 5/2004 | Jeng |
| 6,903,968 B2 | 6/2005 | Jeng |
| 6,906,953 B2 | 6/2005 | Forbes |
| 6,906,962 B2 | 6/2005 | Layman et al. |
| 6,909,635 B2 * | 6/2005 | Forbes .................... G11C 8/08 |
| | | 257/E27.097 |
| 6,992,926 B2 | 1/2006 | Iwase et al. |
| 7,082,057 B2 | 7/2006 | Shibata et al. |
| 7,141,849 B2 | 11/2006 | Iwata et al. |
| 7,151,706 B2 | 12/2006 | Nakamura |
| 7,177,188 B2 | 2/2007 | Iwata et al. |
| 7,187,588 B2 | 3/2007 | Iwata et al. |
| 7,227,234 B2 | 6/2007 | Roizin et al. |
| 7,238,984 B2 | 7/2007 | Shibata et al. |
| 7,271,799 B2 | 9/2007 | Iwata et al. |
| 7,301,198 B2 | 11/2007 | Iwata et al. |
| 7,544,993 B2 | 6/2009 | Iwata et al. |
| 7,582,926 B2 | 9/2009 | Iwata et al. |
| 7,598,559 B2 | 10/2009 | Iwata et al. |
| 7,733,714 B2 * | 6/2010 | Horiuchi ............. G11C 11/5671 |
| | | 365/189.05 |
| 8,451,657 B2 | 5/2013 | Horiuchi |
| 2004/0232475 A1 | 11/2004 | Kataoka et al. |
| 2004/0232477 A1 | 11/2004 | Iwata et al. |
| 2004/0252554 A1 | 12/2004 | Fournel et al. |
| 2006/0125041 A1 | 6/2006 | Yang et al. |
| 2006/0193174 A1 | 8/2006 | Choi et al. |
| 2010/0208518 A1 | 8/2010 | Horiuchi |
| 2011/0133273 A1 | 6/2011 | Shima |

FOREIGN PATENT DOCUMENTS

| | | |
|---|---|---|
| JP | 2001-156188 A | 6/2001 |
| JP | 2002-237540 A | 8/2002 |
| WO | 2004/057621 A1 | 7/2004 |
| WO | 2006/093629 A1 | 9/2006 |

\* cited by examiner

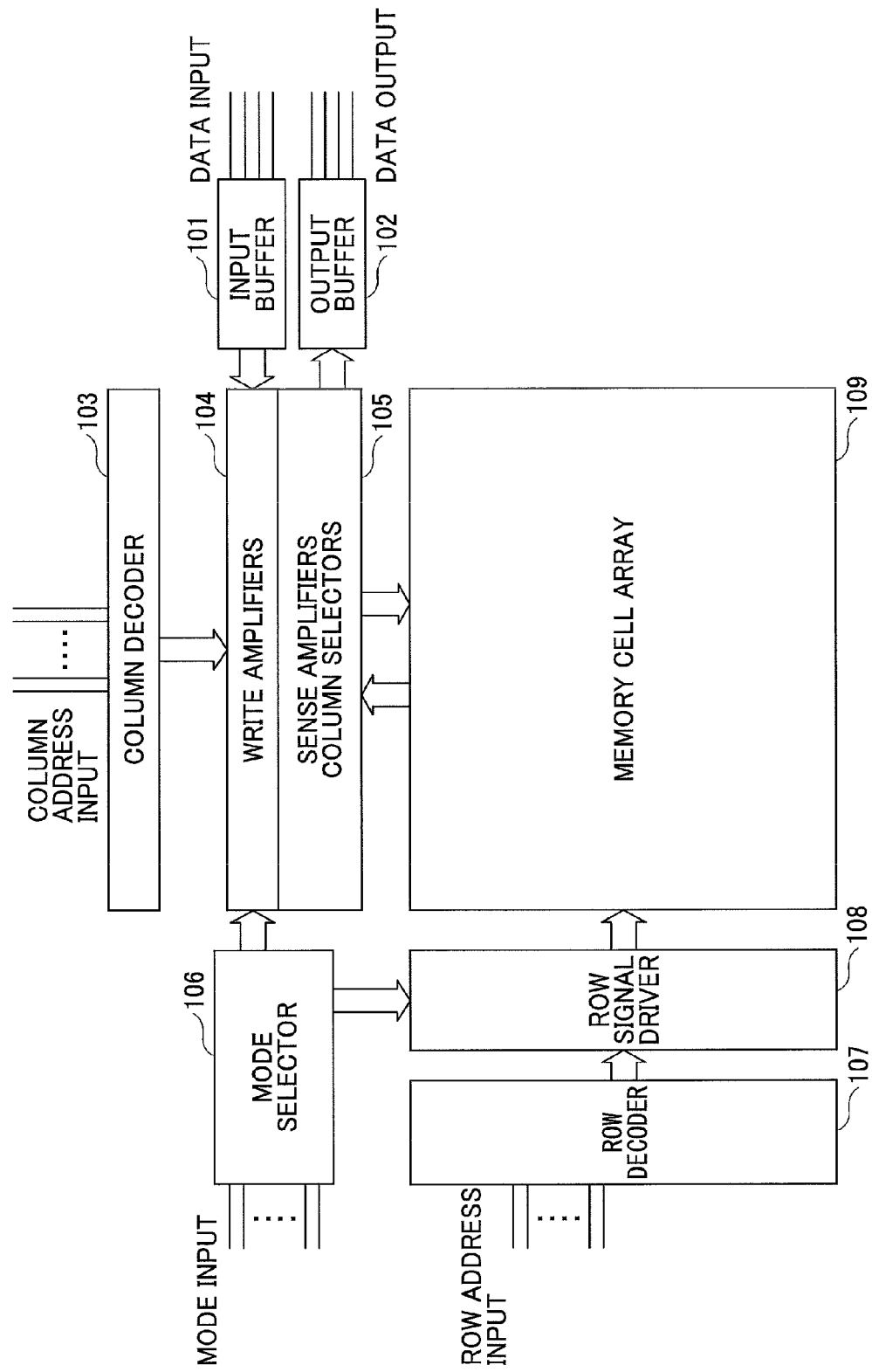

NONVOLATILE MEMORY DEVICE

CROSS REFERENCE TO RELATED APPLICATION

This present application is a continuation of U.S. patent application Ser. No. 15/047,759 filed on Feb. 19, 2016. The disclosures of the above-listed applications are hereby incorporated herein by reference in their entirety.

BACKGROUND OF THE INVENTION

1. Field of the Invention

The disclosures herein generally relate to a nonvolatile memory cell, and particularly relate to a nonvolatile memory cell which is capable of retaining stored data in the absence of a power supply voltage.

2. Description of the Related Art

Nonvolatile semiconductor memory devices, which can retain stored data even in the absence of supplied power, conventionally include flash EEPROM employing a floating gate structure, FeRAM employing a ferroelectric film, MRAMs employing a ferromagnetic film, etc. There is a new type of nonvolatile semiconductor memory device called PermSRAM. PermSRAM uses a MIS (metal-insulating film-semiconductor) transistor as a nonvolatile memory cell. This nonvolatile memory cell has the same structure as an ordinary MIS transistor, and thus requires no special structure such as a floating gate or a special material such as a special material offers an advantage in cost ferroelectric material or ferromagnetic material. The absence of either a special structure or a reduction. PermSRAM was initially disclosed in PCT/JP2003/016143, which was filed on Dec. 17, 2003, the entire contents of which are hereby incorporated by reference.

A MIS transistor serving as a nonvolatile memory cell in PermSRAM is configured to experience a hot-carrier effect on purpose for storage of one-bit data. The hot-carrier effect refers to the injection of electrons into the gate insulating film and/or sidewall of a MIS transistor. This causes a nonvolatile change in the transistor characteristics, which may be a rise in the threshold voltage, i.e., an increase in the channel resistance. A change in the transistor characteristics caused by the hot-carrier effect may be utilized to represent one-bit data "0" or "1". Detecting the stored data may involve the use of a pair of MIS transistors, one of which is designed to experience the hot-carrier effect. A difference in the ON current between the two paired MIS transistors may be detected by using a sense circuit such as a one-bit static memory circuit (i.e., latch) coupled to the pair of MIS transistors.

A hot-carrier effect is asymmetric with respect to the positions of the source and drain of a transistor. When the source node and drain node used to apply a bias for generating a hot-carrier effect are used as a source node and a drain node, respectively, at the time of detecting a drain current, the detected drain current exhibits a relatively small drop caused by the hot-carrier effect. When the source node and drain node used to apply a bias for generating a hot-carrier effect are swapped and used as a drain node and a source node, respectively, at the time of detecting a drain current, the detected drain current exhibits a significant drop caused by the hot-carrier effect. The difference in the detected drain current between these two scenarios is approximately a factor of 10.

Such asymmetric characteristics of a hot-carrier effect are attributable to the fact that most of the electrons injected by the hot-carrier effect into the gate insulating film and/or sidewall are situated closer to the drain node than to the source node. Specifically, the MIS transistor operating in the saturation region has the channel thereof pinched off and closed by a depletion layer near the drain. As a result, the strongest electric field in the horizontal direction occurs in this depletion layer in the proximity of the drain. Some of the electrons accelerated by this strong electric field and thus having high energy are injected into the gate insulating film and/or sidewall in the proximity of the drain.

It may be noted that the gate insulating film and/or sidewall serve as a charge trapping layer. For the purpose of keeping the injected electrons trapped in the charge trapping layer, the use of the sidewall for the trapping purposes may be more preferable than the use of the gate insulating film. This is because the sidewall may be thicker than the gate insulating film, and may also be more easily designed to have a potential well structure for the trapping purposes.

In order to inject electrons into the sidewall on the drain side by applying a bias for generating the hot-carrier effect, it is desirable to ensure the presence of a depletion layer situated directly below the drain-side sidewall. This is because the strongest electrical field in the horizontal direction emerges in such a depletion layer as described above. Since the impurity diffusion regions (i.e. impurity diffusion layers) are formed by utilizing the gate electrode and sidewalls as a mask, the end of an impurity diffusion region tends to be aligned with the end of a sidewall. This ensures the presence of a depletion layer situated directly below the drain-side sidewall.

With advancement in the miniaturization of semiconductor devices, however, it has become more and more difficult to align the end of an impurity diffusion region with the end of a sidewall. Diffusion of ions at the time of doping and at the time of heat treatment causes the impurity diffusion region to spread spatially in the horizontal directions. This results in the end of the impurity diffusion region intruding into areas situated directly below the sidewall.

The provision of a sidewall having substantially wide width may still secure the presence of a depletion layer despite the horizontal spreading of an impurity diffusion region. The miniaturization of semiconductor devices, however, causes the width of sidewalls to become narrower and narrower, resulting in the end of the impurity diffusion region intruding into the area directly below the gate electrode. When this happens, no depletion layer may be present in the area situated directly below the sidewall even when a bias voltage creates a depletion layer inside the impurity diffusion region in the proximity of the end thereof. In such a case, a depletion layer is in existence under the gate electrode, but is not in existence under the sidewall because of the horizontal spreading of the impurity diffusion region. Consequently, the generation of hot carriers does not occur directly below the drain-side sidewall, thereby failing to enable sufficient injection of hot carriers into the sidewall serving as a charge trapping layer.

SUMMARY OF THE INVENTION

It is a general object of the present invention to provide a nonvolatile memory cell that substantially obviates one or more problems caused by the limitations and disadvantages of the related art.

According to an embodiment, a nonvolatile memory cell includes a first-conductivity-type silicon substrate, a metal layer formed in a surface of the first-conductivity-type silicon substrate, a second-conductivity-type diffusion layer formed in the surface of the first-conductivity-type silicon substrate and spaced apart from the metal layer, an insulating film disposed on the surface of the first-conductivity-type silicon substrate between the metal layer and the second-conductivity-type diffusion layer, a gate electrode disposed on the insulating film between the metal layer and the second-conductivity-type diffusion layer, and a sidewall disposed at a same side of the gate electrode as the metal layer and situated between the gate electrode and the metal layer, the sidewall being made of insulating material.

Other objects and further features of the present invention will be apparent from the following detailed description when read in conjunction with the accompanying drawings.

BRIEF DESCRIPTION OF THE DRAWINGS

FIG. 16 is a block diagram illustrating an example of the configuration of a nonvolatile semiconductor memory device.

DESCRIPTION OF THE PREFERRED EMBODIMENTS

In the following, embodiments of the present invention will be described with reference to the accompanying drawings. In these drawings, the same or similar elements are referred to by the same or similar numerals, and a description thereof will be omitted as appropriate.

Figure 1:
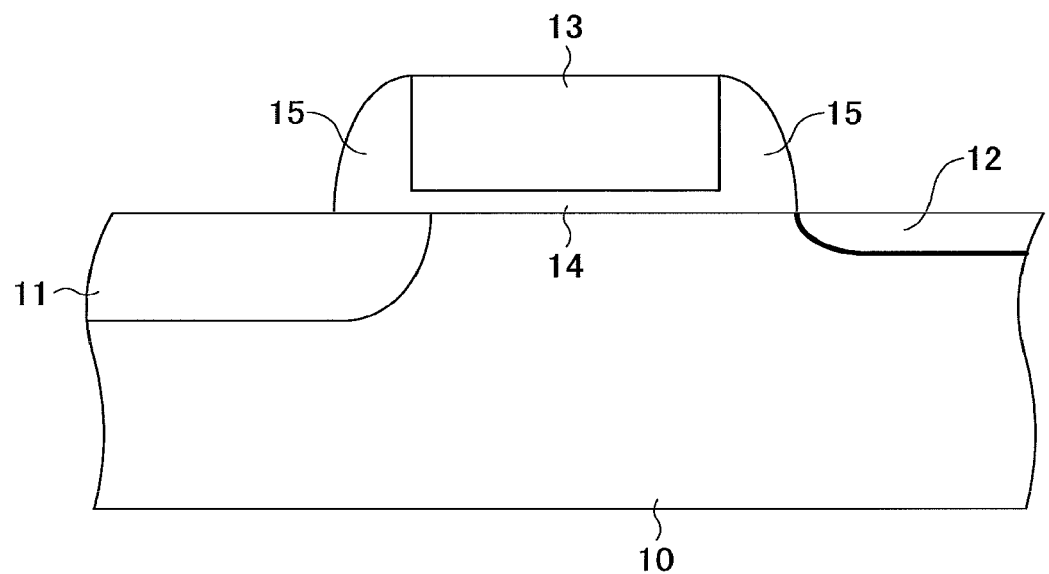
FIG. 1 is a drawing illustrating an example of the configuration of a nonvolatile memory cell according to an embodiment.

FIG. 1 is a drawing illustrating an example of the configuration of a nonvolatile memory cell according to an embodiment. In FIG. 1, the nonvolatile memory cell includes a first-conductivity-type silicon substrate 10, a second-conductivity-type diffusion layer 11, a metal layer 12, a gate electrode 13, a gate insulating film 14, and sidewalls 15. The first conductivity type is either a p-conductivity type or n-conductivity type, and the second conductivity type is opposite the first conductivity type. It may be noted that the first-conductivity-type silicon substrate 10 may be a first-conductivity-type well formed in a second-conductivity-type substrate.

The second-conductivity-type diffusion layer 11 is formed in the surface of the first-conductivity-type silicon substrate 10 by doping second-conductivity-type impurities into the surface. The metal layer 12 is formed in the surface of the first-conductivity-type silicon substrate 10 such as to form a Schottky barrier junction with the first-conductivity-type silicon substrate 10, i.e., to form a Schottky barrier at the interface with the first-conductivity-type silicon substrate 10. The gate electrode 13 is disposed on the gate insulating film 14 that is formed on the surface of the first-conductivity-type silicon substrate 10. The sidewalls 15 are formed on the first-conductivity-type silicon substrate 10 or on the gate insulating film 14 on both sides of the gate electrode 13.

The metal layer 12 and the second-conductivity-type diffusion layer 11 are separate and spaced apart from each other, and have a portion of the first-conductivity-type silicon substrate 10 therebetween. This portion of the first-conductivity-type silicon substrate 10 serves as a channel for providing electrical conduction.

The end of the second-conductivity-type diffusion layer 11 toward the metal layer 12 may be situated under one of the sidewalls 15 or under the gate electrode 13 because of the diffusion of impurities at the time of doping and subsequent heat treatment. On the other hand, the end of the metal layer 12 toward the second-conductivity-type diffusion layer 11 is aligned with the outer lateral face of the other one of the sidewalls 15. Namely, the horizontal position of the end of the metal layer 12 toward the second-conductivity-type diffusion layer 11 is situated directly below the horizontal position of the lower end of such a sidewall lateral face, so that these two horizontal positions coincide with each other as viewed from the above, i.e., as viewed in the thickness direction of the first-conductivity-type silicon substrate 10.

It may be noted that this sidewall 15 is situated between the gate electrode 13 and the metal layer 12, and serves to separate the metal layer 12 from the gate electrode 13. No portion of the metal layer 12 is in existence directly below the sidewall 15 that is situated on the same side of the gate electrode 13 as the metal layer 12. The sidewall 15 situated toward the metal layer 12 also serves as a charge trapping layer. The sidewall 15 may have a potential well formed therein so as to have an increased charge trapping ability.

The first-conductivity-type silicon substrate 10 may be a p-type substrate, and the second-conductivity-type diffusion layer 11 is an n-type diffusion layer. In such a case, the nonvolatile memory cell illustrated in FIG. 1 is an n-channel MOSFET.

The metal layer 12 may be made of nickel silicide (NiSi), cobalt silicide ($CoSi_2$), titanium silicide ($TiSi_2$), or platinum silicide (PtSi). Such a metal silicide layer may be formed by performing silicidation in the surface of the first-conductivity-type silicon substrate 10. To this end, a metal layer may be deposited on the surface of the first-conductivity-type silicon substrate 10, followed by applying heat to perform an anneal (sintering) process between the metal layer and the first-conductivity-type silicon substrate 10. The gate electrode 13 and the sidewalls 15 serve as a mask during this silicidation process. The silicidation process is different from the impurity doping process by nature, and is capable of producing a metal silicide layer that is aligned with the mask with high precision. The resulting metal layer 12 is thus aligned with the sidewalls 15 as previously described.

Figure 2:
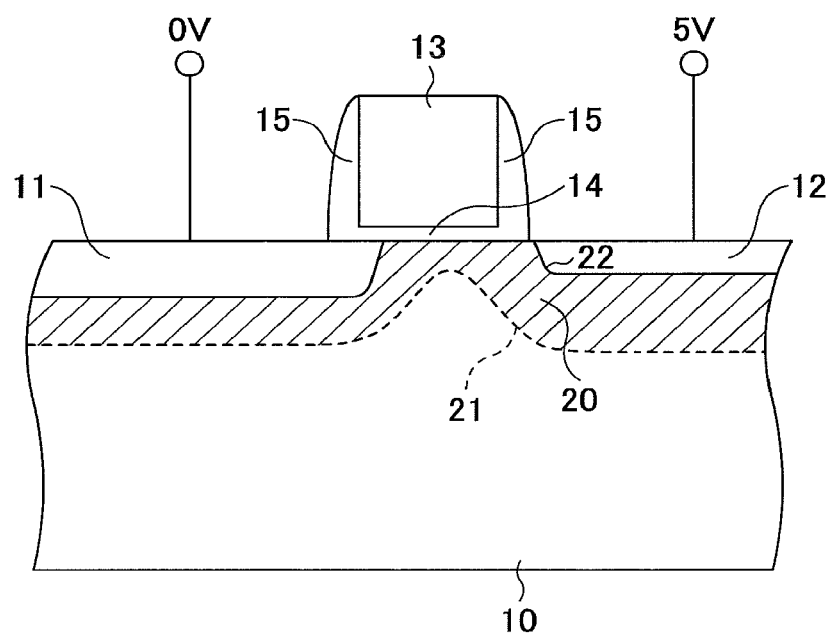
FIG. 2 is a drawing illustrating the formation of a depletion layer in the nonvolatile memory cell illustrated in FIG. 1.

FIG. 2 is a drawing illustrating the formation of a depletion layer in the nonvolatile memory cell illustrated in FIG. 1. The nonvolatile memory cell illustrated in FIG. 2 is an n-channel MOSFET. Namely, the first-conductivity-type silicon substrate 10 is a p-type substrate, and the second-conductivity-type diffusion layer 11 is an n-type diffusion layer.

At the time of creating a hot-carrier effect for data writing, the metal layer 12 is used as a drain node, and the second-conductivity-type diffusion layer 11 is used as a source node. Namely, a high voltage (e.g., 5 V) is applied to the metal layer 12, and a low voltage (e.g., 0 V) is applied to the second-conductivity-type diffusion layer 11. In the absence of a positive voltage being applied to the gate electrode 13, the Schottky-barrier junction between the metal layer 12 and the first-conductivity-type silicon substrate 10 is reverse-biased under this condition. No electric current thus flows between the metal layer 12 and the second-conductivity-type diffusion layer 11.

A positive voltage applied to the gate electrode 13, i.e., a voltage applied to the gate electrode 13 being higher than the low voltage, serves to form a depletion layer 20 in the first-conductivity-type silicon substrate 10 as illustrated in FIG. 2. A boundary line 21 indicates the boundary of the depletion layer 20. The shape and position of the boundary line 21 depends on the magnitude of electrical potentials applied to the nonvolatile memory cell.

As the positive voltage applied to the gate electrode 13 increases, an n-type inversion layer appears near the surface of the first-conductivity-type silicon substrate 10 between the second-conductivity-type diffusion layer 11 and the metal layer 12, thereby creating a channel for electrical conduction. With the presence of such an inversion layer, the junction between the metal layer 12 and the n-type inversion layer is forward-biased, thereby allowing electric current to flow between the metal layer 12 and the second-conductivity-type diffusion layer 11.

A further increase of the positive voltage applied to the gate electrode 13 causes the inversion layer to be pinched off near the end of the metal layer 12. The depletion layer 20 thus reemerges directly below the sidewall 15 situated toward the metal layer 12. As a result, the strongest electric field in the horizontal direction occurs in this depletion layer formed directly below the sidewall 15 situated in the proximity of the drain. Some of the electrons accelerated by this strong electric field and having high energy are injected into the sidewall 15 situated toward the metal layer 12 (i.e., the sidewall 15 situated on the same side of the gate electrode 13 as the metal layer 12).

It may be noted that the functions and operations of the n-channel MOSFET illustrated in FIG. 2 as described above also apply in the case of the nonvolatile memory cell being a p-channel MOSFET. In the case of a p-channel MOSFET also, the metal layer 12 is used as a drain node, and the second-conductivity-type diffusion layer 11 is used as a source node when the hot-carrier effect is generated. Namely, a low voltage (e.g., −5 V) is applied to the metal layer 12, and a high voltage (e.g., 0 V) is applied to the second-conductivity-type diffusion layer 11, with a voltage lower than the high voltage being applied to the gate electrode 13. Holes generated by the hot-carrier effect are injected into the sidewall 15 situated toward the metal layer 12 (i.e., the sidewall 15 situated on the same side of the gate electrode 13 as the metal layer 12).

In the following, a description will be given of the use of a metal silicide layer as a source node. There may be two issues to be taken into consideration. The first issue is whether a metal layer can be used in place of the second-conductivity-type diffusion layer 11 in the nonvolatile memory cell illustrated in FIG. 1. The second issue is whether the use of the metal layer 12 in FIG. 1 as a source node at the time of reading data from the nonvolatile memory cell gives rise to a problem of large parasitic resistance.

Figure 3:
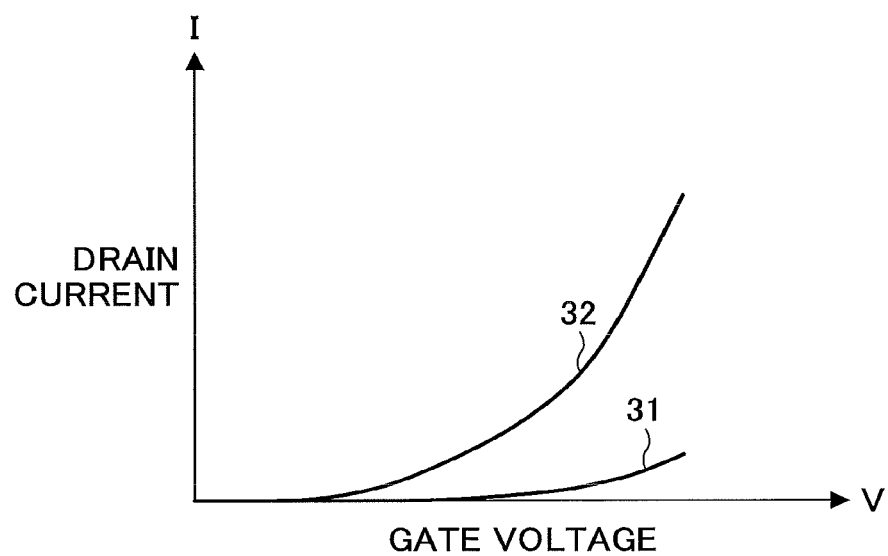
FIG. 3 is a drawing illustrating the relationship between the gate voltage and the drain current of a nonvolatile memory cell.

FIG. 3 is a drawing illustrating the relationship between the gate voltage and the drain current of a nonvolatile memory cell. In FIG. 3, the horizontal axis represents gate voltage, and the vertical axis represents drain current. A characteristic curve 32 represents the amount of drain current varying in response to changes in the gate voltage when the source region is made of an impurity diffusion region. A characteristic curve 31 represents the amount of drain current varying in response to changes in the gate voltage when the source region is made of a metal silicide layer. The structures and configurations of other elements such as the structure and configuration of the source node are the same between the characteristic curve 31 and the characteristic curve 32.

As can be seen from FIG. 3, the amount of drain current is significantly smaller in the case of the source region being a metal silicide layer than in the case of the source region being an impurity diffusion region. This is because the Schottky barrier between the substrate and the metal silicide layer creates a large parasitic resistance when the metal silicide layer is used as the source node. It may be noted that when an inversion layer is formed on the surface of the substrate, the Schottky-barrier junction between the inversion layer and the metal silicide layer at the source node is reverse-biased. A high concentration of carriers in the inversion layer, however, causes the Schottky barrier to be extremely thin, thereby allowing carriers to tunnel through the thin barrier. The large parasitic resistance described above appears at the junction when the carriers tunnel through the thin barrier.

Generation of a hot-carrier effect having a sufficient magnitude is important for the purpose of writing data to the nonvolatile memory cell illustrated in FIG. 1. To this end, a sufficient amount of drain current is necessary. The use of an impurity diffusion region such as the second-conductivity-type diffusion layer 11 of FIG. 1 as the source region is thus preferable to the use of a metal layer as the source region at the time of writing data to the nonvolatile memory cell.

The second issue relates to the use of the metal layer 12 in FIG. 1 as a source node at the time of reading data from the nonvolatile memory cell. As was previously described, a node used as a drain node at the time of writing data to the nonvolatile memory cell is used as a source node at the time of reading data from the nonvolatile memory cell. This is because such swapping of the drain and source nodes is preferable in consideration of the asymmetric characteristics of the hot-carrier effect. The use of the metal layer 12 as a source node at the time of reading data, however, may present an issue of a large parasitic capacitance appearing at the source node.

Since some drain current still flows as illustrated in FIG. 3, the use of the metal layer 12 as a source node is still viable, considering the fact that an amount of drain current needed at the time of reading data may be smaller than the amount of drain current needed to create a hot-carrier effect. However, it is still preferable to secure a sufficient amount of drain current despite the use of a metal silicide layer at the source node. One way to do so is to decrease the concentration of the substrate in the vicinity of the source region. With such a decreased concentration, the carrier concentration of an inversion layer formed around the source region is higher, and, also, the inversion layer easily reaches the end of the metal layer serving as the source node when being extended by the fringe electrical field. The thickness of the Schottky barrier thus becomes still thinner between the metal silicide layer and the inversion layer, so that electrons can tunnel through this thin barrier with an increased ease. Such a tunneling effect reduces the parasitic resistance at the source region, thereby serving to increase the drain current.

Further, it is preferable to make the substrate concentration (i.e., impurity concentration in the substrate) near the impurity diffusion layer higher than the substrate concentration (i.e., impurity concentration in the substrate) near the metal silicide layer. This ensures the prevention of a short channel effect and the provision of an appropriate threshold voltage. Specifically, the second-conductivity-type diffusion layer is preferably enclosed by a first-conductivity-type diffusion layer that has higher impurity concentration than the first-conductivity-type silicon substrate.

Figure 4:
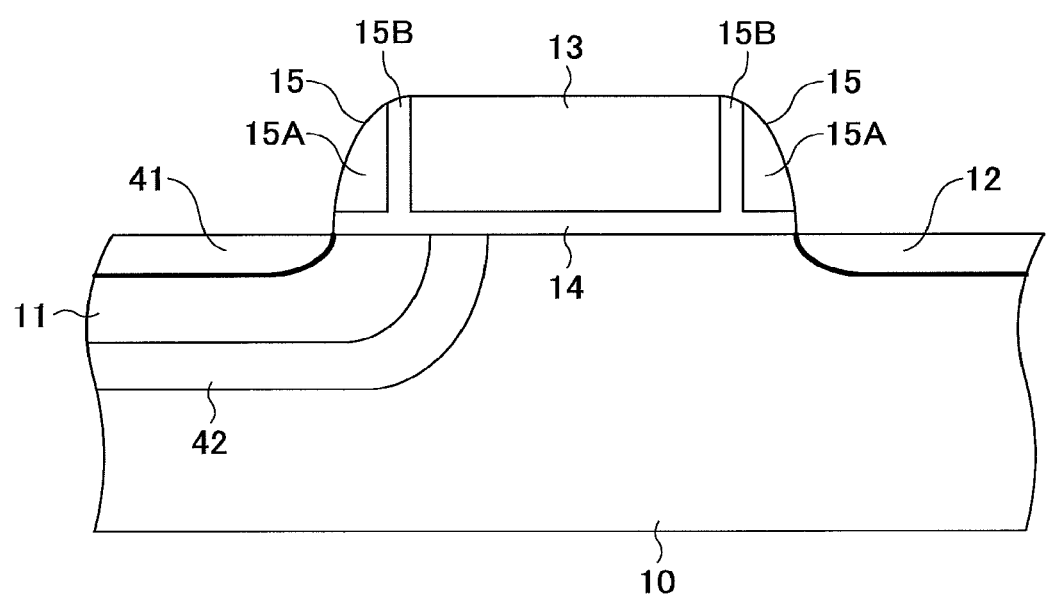
FIG. 4 is a drawing illustrating an example of the detailed configuration of the nonvolatile memory cell illustrated in FIG. 1.

FIG. 4 is a drawing illustrating an example of the detailed configuration of the nonvolatile memory cell illustrated in FIG. 1. The nonvolatile memory cell illustrated in FIG. 4 is an n-channel MOSFET. The nonvolatile memory device includes a p-type silicon substrate 10, an n-type diffusion layer 11, a metal silicide layer 12, a gate electrode 13, a gate insulating film 14, and sidewalls 15. The nonvolatile memory device further includes a metal silicide layer 41 and a middle-concentration p-type diffusion layer 42.

The p-type silicon substrate 10 has low carrier concentration (i.e., low hole concentration). As was previously described, such low carrier concentration ensures the viable use of the metal silicide layer 12 as a drain node at the time of generating a hot-carrier effect (i.e., at the time of writing data). The middle-concentration p-type diffusion layer 42 that has higher hole concentration than the p-type silicon substrate 10 is formed around, and encloses, the n-type diffusion layer 11. The provision of the middle-concentration p-type diffusion layer 42 around the n-type diffusion layer 11 ensures the prevention of a short channel effect and the provision of an appropriate threshold voltage.

The n-type diffusion layer 11 and the middle-concentration p-type diffusion layer 42, when used as a drain node or a source node, function as a pn junction despite the presence of the metal silicide layer 41 disposed within the n-type diffusion layer 11. Since the n-type diffusion layer 11 has sufficiently high electron concentration, the Schottky barrier between the metal silicide layer 41 and the n-type diffusion layer 11 is extremely thin so as to allow electrons to tunnel therethrough when reverse-biased. The adverse effect of the Schottky barrier can thus be negligible while the metal silicide layer 41 is capable of reducing the effective resistance of the n-type diffusion layer 11. Because of such a resistance reduction effect, it is preferable to form the metal silicide layer 41 inside the n-type diffusion layer 11.

The p-type silicon substrate 10 and the metal silicide layer 12 create a Schottky barrier when the electron affinity of the p-type silicon substrate 10 plus the bandgap of the p-type silicon substrate 10 are greater than the work function of the metal silicide layer 12. In the presence of a Schottky barrier, the junction between the metal silicide layer 12 and the p-type silicon substrate 10 provides electrical insulation when the potential of the metal silicide layer 12 is higher than the potential of the p-type silicon substrate 10. In order to ensure the provision of a Schottky barrier, the metal silicide layer 12 may be made of nickel silicide (work function=4.8 eV), cobalt silicide (work function=4.6 eV), titanium silicide (work function=4.5 eV), or platinum silicide (work function=4.9 eV), for example.

Each of the sidewalls 15 has a two-layer structure that is constituted by a silicon-nitride film 15A and a silicon oxide film 15B. An energy barrier between silicon nitride and p-type silicon is 2.1 eV, and an energy barrier between silicon oxide and p-type silicon is 3.2 eV. Because of this, electrons having reached the silicon-nitride film 15A do not return to the p-type silicon substrate 10 due to the presence of the potential barrier at the junction between the silicon-nitride film 15A and the silicon oxide film 15B. In other words, the two-layer structure comprised of the silicon-nitride film 15A and the silicon oxide film 15B serves to retain electrons injected into the silicon-nitride film 15A. A three-layer structure comprised of a silicon oxide film, a silicon nitride film, and a silicon oxide film arranged in this order also has the function to retain injected electrons, and may be used in place of the two-layer structure.

In the following, a description will be given of a method of producing the nonvolatile memory device illustrated in FIG. 4. FIG. 5 through FIG. 12 are drawings illustrating a method of producing the nonvolatile memory device illustrated in FIG. 4.

Figure 5:
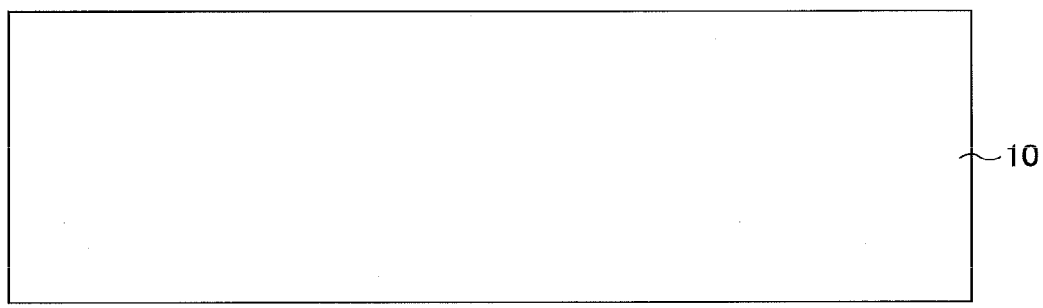
FIG. 5 is a drawing illustrating a method of producing the nonvolatile memory device illustrated in FIG. 4.
Figure 6:
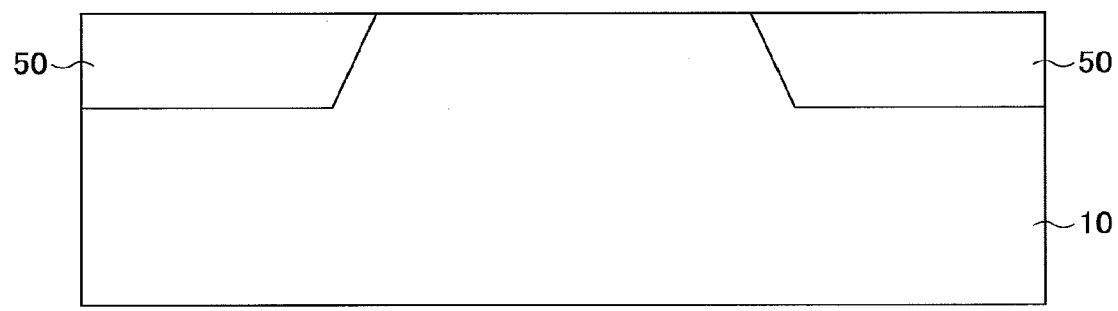
FIG. 6 is a drawing illustrating the method of producing the nonvolatile memory device illustrated in FIG. 4.
Figure 7:
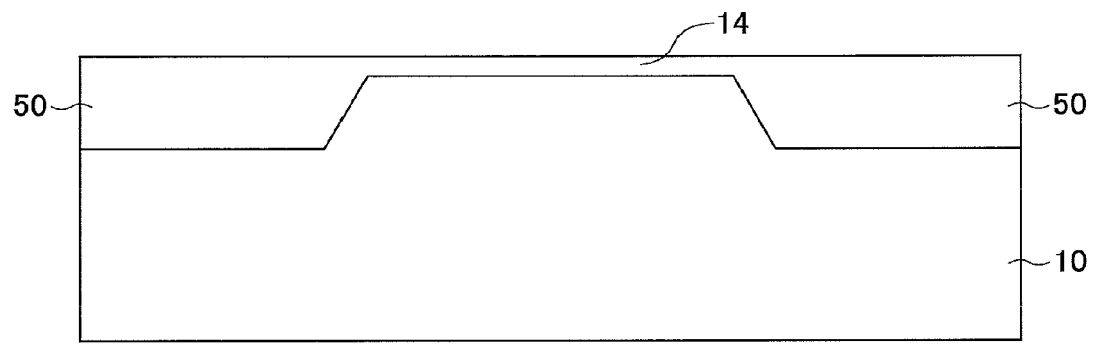
FIG. 7 is a drawing illustrating a method of producing the nonvolatile memory device illustrated in FIG. 4.

The p-type silicon substrate 10 having low carrier concentration illustrated in FIG. 5 is subjected to a shallow trench isolation process including etching trenches, depositing dielectric material (e.g., silicon oxide) in the trenches, and removing excess dielectric material to create device isolation 50 as illustrated in FIG. 6. The p-type silicon substrate 10 with the device isolation 50 is then oxidized to form a gate insulating film 14 (i.e., silicon oxide film) in the surface of the p-type silicon substrate 10 as shown in FIG. 7.

Figure 8:
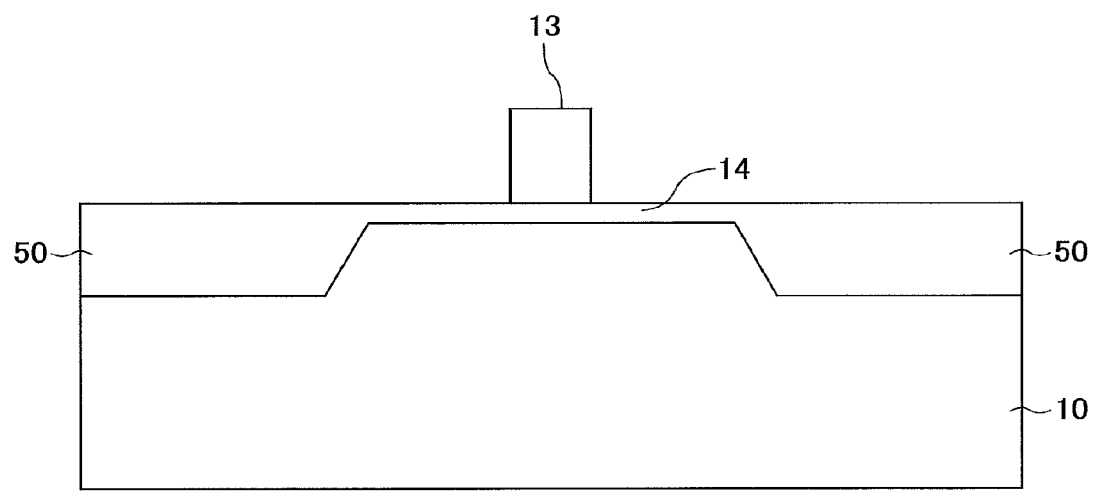
FIG. 8 is a drawing illustrating a method of producing the nonvolatile memory device illustrated in FIG. 4.
Figure 9:
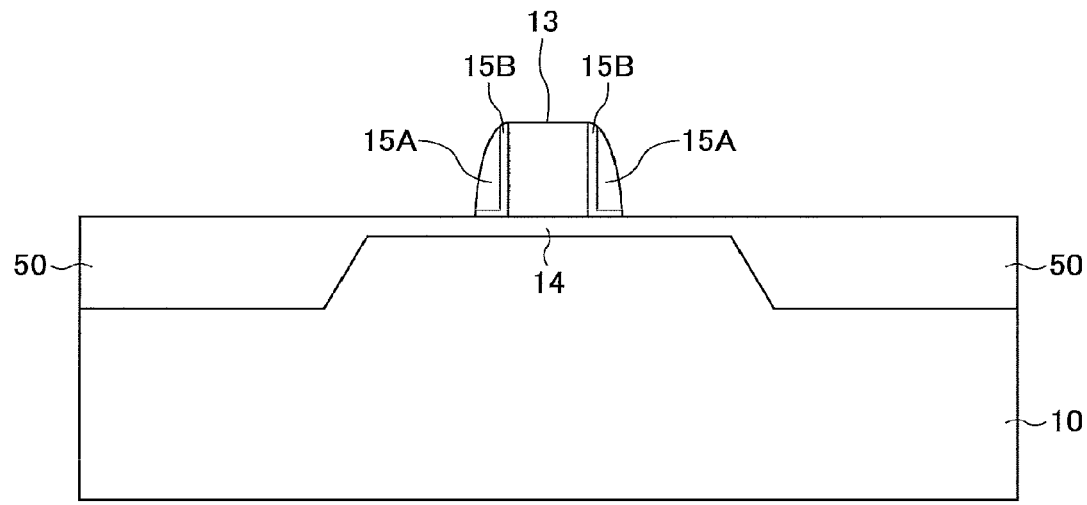
FIG. 9 is a drawing illustrating a method of producing the nonvolatile memory device illustrated in FIG. 4.

FIG. 8 shows a gate electrode 13 that is formed on the gate insulating film 14 by chemical vapor deposition and pattern etching, for example. After forming the gate electrode 13, the sidewalls comprised of the silicon-nitride film 15A and the silicon oxide film 15B are formed at both sides of the gate electrode 13 on the gate insulating film 14 as illustrated in FIG. 9. Processes for forming these sidewalls typically include forming a silicon oxide film and a silicon nitride film through chemical vapor deposition and performing reactive ion etching.

Figure 10:
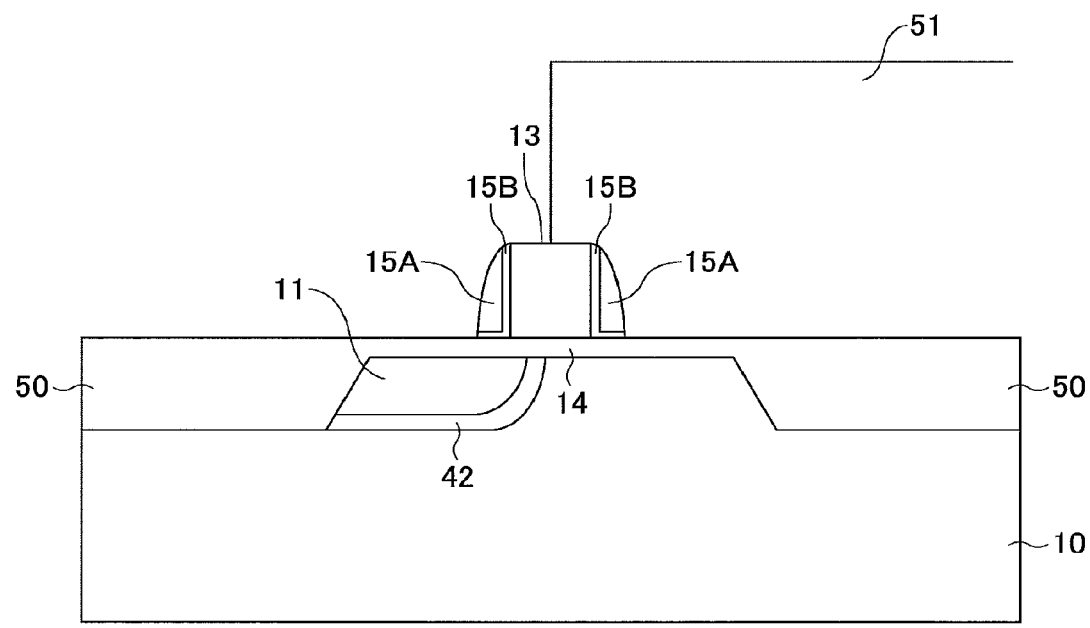
FIG. 10 is a drawing illustrating a method of producing the nonvolatile memory device illustrated in FIG. 4.

FIG. 10 illustrates the formation of an n-type diffusion layer 11 and a middle-concentration p-type diffusion layer 42. First, a photo resist mask 51 is formed at one side of the gate electrode 13 to cover the gate insulating film 14 and the p-type silicon substrate 10 as illustrated in FIG. 10. Arsenic is then doped into the p-type silicon substrate 10 to form the n-type diffusion layer 11 only at the side of the gate electrode 13 where the photo resist mask 51 is absent. Boron is concurrently doped into the p-type silicon substrate 10 while using the same photo resist mask 51 to form the middle-concentration p-type diffusion layer 42.

Figure 11:
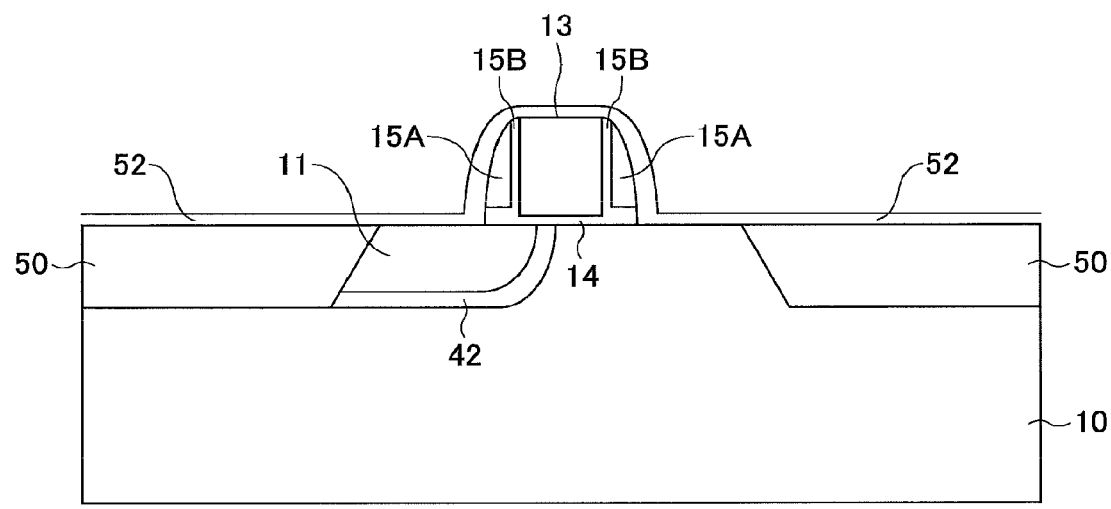
FIG. 11 is a drawing illustrating a method of producing the nonvolatile memory device illustrated in FIG. 4.

Subsequently, the photo resist mask 51 is removed, and the gate insulating film 14 is also removed, except where the gate electrode 13 and the sidewalls 15A and 15B are situated. A nickel layer 52 is then formed on the p-type silicon substrate 10 having the device isolation 50, the n-type diffusion layer 11, and the high-concentration p-type diffusion layer 42. The nickel layer 52 is also formed on the gate electrode 13 and on the sidewalls 15A and 15B. FIG. 11 illustrates the nickel layer 52 disposed on the elements noted above.

Figure 12:
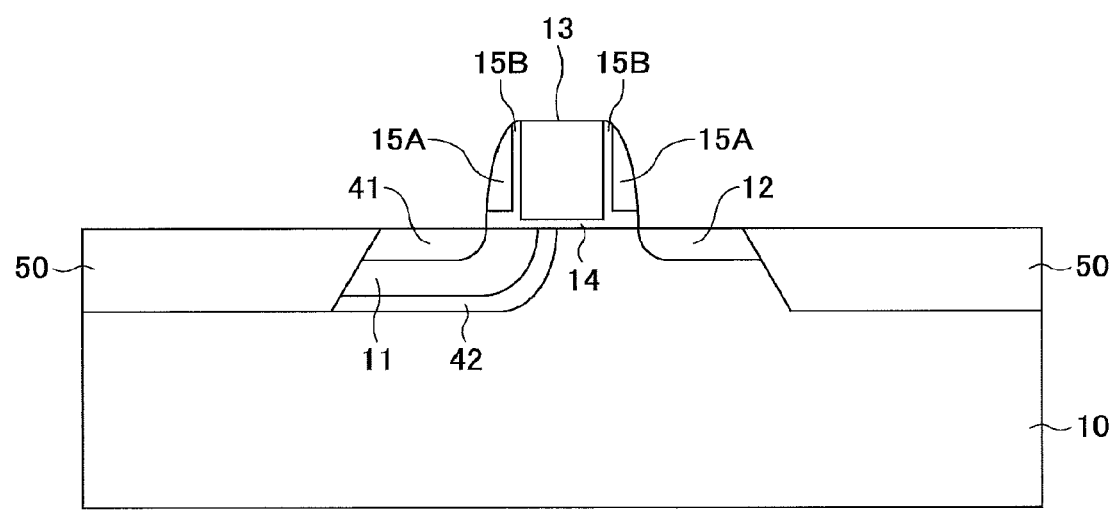
FIG. 12 is a drawing illustrating a method of producing the nonvolatile memory device illustrated in FIG. 4.

After depositing the nickel layer 52, heat is applied to perform an anneal (sintering) process between the nickel layer 52 and the p-type silicon substrate 10, thereby forming metal silicide layers 12 and 41 as illustrated in FIG. 12. The gate electrode 13 and the sidewalls 15A and 15B serve as a mask during this silicidation process. The silicidation process is different from the impurity doping process by nature, and is capable of producing the metal silicide layers 12 and 41 that are aligned with the mask with high precision. The resulting metal layers 12 and 41 are thus aligned with the sidewalls 15A and 15B as illustrated in FIG. 12.

Figure 13:
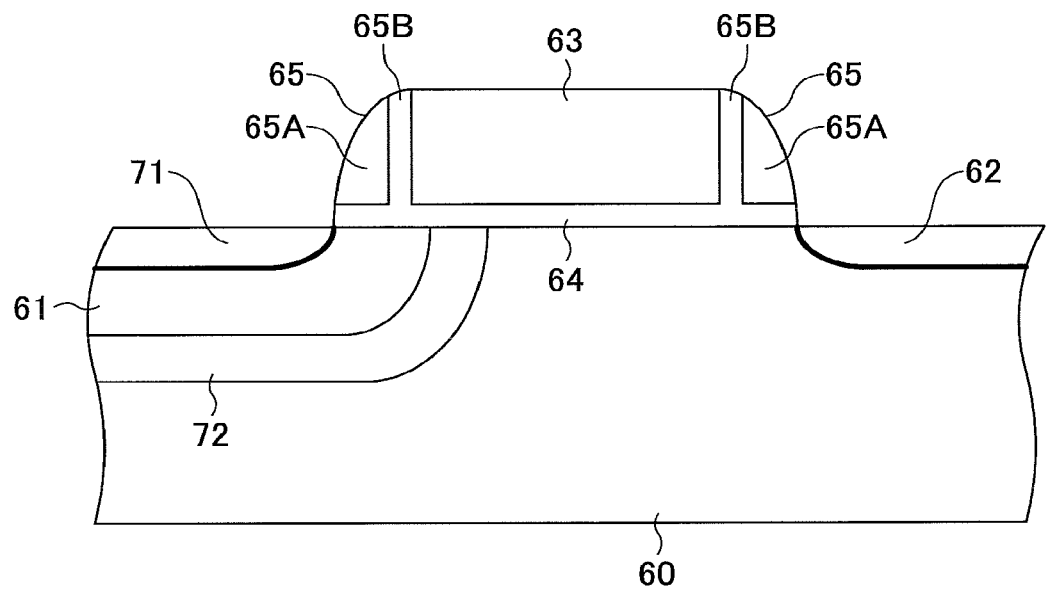
FIG. 13 is a drawing illustrating another example of the detailed configuration of the nonvolatile memory cell illustrated in FIG. 1.

FIG. 13 is a drawing illustrating another example of the detailed configuration of the nonvolatile memory cell illustrated in FIG. 1. The nonvolatile memory cell illustrated in FIG. 13 is a p-channel MOSFET. The nonvolatile memory device includes an n-type silicon substrate 60, a p-type diffusion layer 61, a metal silicide layer 62, a gate electrode 63, a gate insulating film 64, and sidewalls 65. The nonvolatile memory device further includes a metal silicide layer 71 and a middle-concentration n-type diffusion layer 72.

The n-type silicon substrate 60 has low carrier concentration (i.e., low electron concentration). As was previously described, such low carrier concentration ensures the viable use of the metal silicide layer 62 as a drain node at the time of generating a hot-carrier effect (i.e., at the time of writing data). The middle-concentration n-type diffusion layer 72 that has higher electron concentration than the n-type silicon substrate 60 is formed around, and encloses, the p-type diffusion layer 61. The provision of the middle-concentration n-type diffusion layer 72 around the p-type diffusion layer 61 ensures the prevention of a short channel effect and the provision of an appropriate threshold voltage.

The p-type diffusion layer 61 and the middle-concentration n-type diffusion layer 72, when used as a drain node or a source node, function as a pn junction despite the presence of the metal silicide layer 71 disposed within the p-type diffusion layer 61. Since the p-type diffusion layer 71 has sufficiently high hole concentration, the Schottky barrier between the metal silicide layer 71 and the p-type diffusion layer 61 is extremely thin so as to allow holes to tunnel therethrough when reverse-biased. The adverse effect of the Schottky barrier can thus be negligible while the metal silicide layer 71 is capable of reducing the effective resistance of the p-type diffusion layer 61. Because of such a resistance reduction effect, it is preferable to form the metal silicide layer 71 inside the p-type diffusion layer 61.

Each of the sidewalls 65 has a two-layer structure that is constituted by a silicon-nitride film 65A and a silicon oxide film 65B. Holes having reached the silicon-nitride film 65A do not return to the n-type silicon substrate 60 due to the presence of the potential barrier at the junction between the silicon-nitride film 65A and the silicon oxide film 65B. In other words, the two-layer structure comprised of the silicon-nitride film 65A and the silicon oxide film 65B serves to retain holes injected into the silicon-nitride film 65A. A three-layer structure comprised of a silicon oxide film, a silicon nitride film, and a silicon oxide film arranged in this order also has the function to retain injected electrons, and may be used in place of the two-layer structure.

Figure 14:
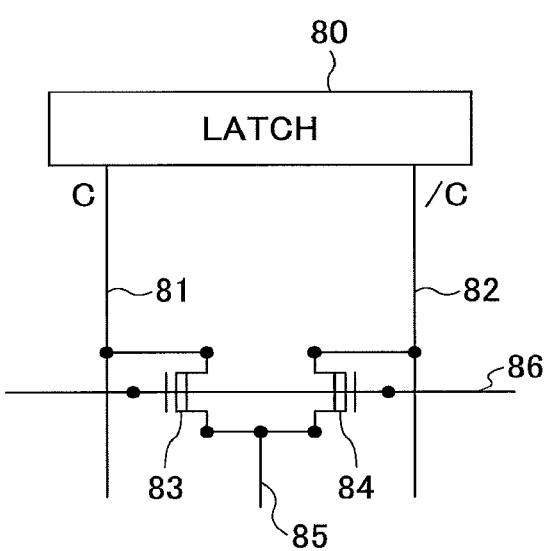
FIG. 14 is a drawing illustrating an example of the circuit configuration of a nonvolatile memory device.

FIG. 14 is a drawing illustrating an example of the circuit configuration of a nonvolatile memory device. The memory circuit illustrated in FIG. 14 includes a latch circuit 80, bit lines 81 and 82, nonvolatile memory cell transistors 83 and 84, a voltage control line 85, and a word line 86.

The nonvolatile memory cell transistors 83 and 84 are n-channel MOSFETs that have the structure illustrated in FIG. 1 or in FIG. 4. The metal silicide layers 12 of the nonvolatile memory cell transistors 83 and 84 are coupled to the voltage control line 85. The n-type diffusion layers 11 (or the metal silicide layers 41 in the case of the configuration illustrated in FIG. 4) of the nonvolatile memory cell transistors 83 and 84 are coupled to the bit lines 81 and 82, respectively. The gate electrodes 13 of the nonvolatile memory cell transistors 83 and 84 are coupled to the word line 86.

The latch circuit 80 may include two cross-coupled inverters which have the outputs thereof connected to the inputs of each other. Upon power-on of these inverters, nodes C and /C are set to HIGH and LOW or to LOW and HIGH, respectively, depending on which one of these nodes is higher than the other in the initial state. In this manner, the latch circuit 80 serves as a sense amplifier that amplifies a difference in the signal level between the nodes C and /C. The nodes C and /C are coupled to the bit lines 81 and 82, respectively.

At the time of writing data, one-bit data is transferred from an external source to and stored in the latch circuit 80, so that the nodes C and /C of the latch circuit 80 are set to HIGH (e.g., 1.8 V) and LOW (e.g., 0 V) or to LOW and HIGH, respectively. The word line 86 is set to HIGH, and the voltage control line 85 may be set to extra HIGH (e.g., 5.0 V). With these voltage settings, one of the nonvolatile memory cell transistors 83 and 84 that has the source node thereof coupled to LOW experiences a hot-carrier effect while the other one of the nonvolatile memory cell transistors 83 and 84 does not.

At the time of reading data, the word line 86 is set to HIGH, and the voltage control line 85 is set to LOW, followed by activating the latch circuit 80. With the voltage control line 85 being set to LOW, the metal silicide layers 12 coupled to the voltage control line 85 serve as source nodes. Upon activation of the latch circuit 80, the nodes C and /C are forced to become HIGH and LOW, or LOW and HIGH, respectively. One of the nonvolatile memory cell transistors 83 and 84 has electric charge (i.e., trapped electrons) on the source side, and thus has a relatively small drain current compared with the drain current of the other one of the transistors, which has no electric charge on the source side. Such a difference in the drain currents of the two nonvolatile memory cell transistors 83 and 84 creates a difference in the potential between the bit lines 81 and 82, and thus between the nodes C and /C. Such a difference in the potential is amplified and detected by the latch circuit 80.

Figure 15:
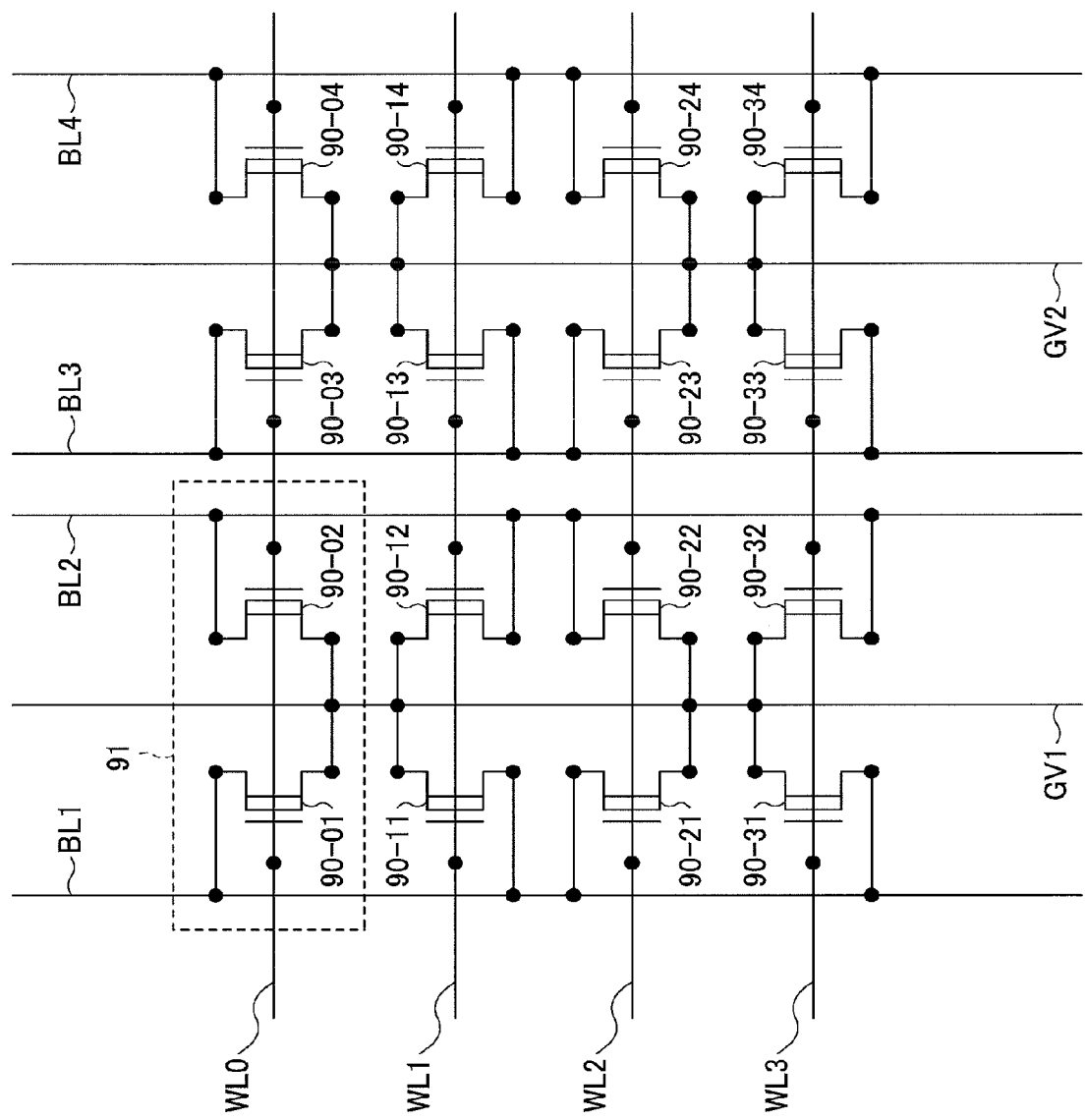
FIG. 15 is a drawing illustrating an example of the configuration of a memory array.

FIG. 15 is a drawing illustrating an example of the configuration of a memory array. The memory array illustrated in FIG. 15 includes nonvolatile memory cell transistors 90-01 through 90-04, 90-11 through 90-14, 90-21 through 90-24, and 90-31 through 90-34, bit lines BL1 through BL4, voltage control lines GV1 and GV, and word lines WL0 through WL3.

The nonvolatile memory cell transistors 90-01 through 90-04, 90-11 through 90-14, 90-21 through 90-24, and 90-31 through 90-34 are n-channel MOSFETs that have the structure illustrated in FIG. 1 or in FIG. 4. The metal silicide layers 12 of the nonvolatile memory cell transistors 90-01 and 90-02, 90-11 and 90-12, 90-21 and 90-22, as well as 90-31 and 90-32 are coupled to the voltage control line GV1. The metal silicide layers 12 of the nonvolatile memory cell transistors 90-03 and 90-04, 90-13 and 90-14, 90-23 and 90-24, as well as 90-33 and 90-34 are coupled to the voltage control line GV2. The n-type diffusion layers 11 (or the metal silicide layers 41 in the case of the configuration illustrated in FIG. 4) of the nonvolatile memory cell transistors 90-01 and 90-02, 90-11 and 90-12, 90-21 and 90-22, as well as 90-31 and 90-32 are coupled to the bit lines BL1 and BL2, respectively. The n-type diffusion layers 11 (or the metal silicide layers 41 in the case of the configuration illustrated in FIG. 4) of the nonvolatile memory cell transistors 90-03 and 90-04, 90-13 and 90-14, 90-23 and 90-24, as well as 90-33 and 90-34 are coupled to the bit lines BL3 and BL4, respectively. The gate electrodes 13 of the nonvolatile memory cell transistors 90-01 through 90-04, 90-11 through 90-14, 90-21 through 90-24, and 90-31 through 90-34 are coupled to the word lines WL1, WL2, WL3, and WL4, respectively.

The bit lines BL1 and BL2 are coupled to the nodes C and /C of a latch circuit similar to the latch circuit 80 illustrated in FIG. 14. The bit lines BL3 and BL4 are coupled to the nodes C and /C of a latch circuit similar to the latch circuit 80. Two adjacent nonvolatile memory cell transistors coupled to the same voltage control line serves as a transistor pair to store one-bit data. For example, a transistor pair 91 comprised of the nonvolatile memory cell transistors 90-01 and 90-02 serve to store one-bit data in the same manner as the nonvolatile memory cell transistors 83 and 84 illustrated in FIG. 14.

At the time of writing data, one of the word lines WL0 through WL3 is set to HIGH, and one of the voltage control lines GV1 and GV2 may be set to extra HIGH. These settings cause the pair of nonvolatile memory cell transistors situated at the intersection between the activated word line (i.e., the selected row) and the activated voltage control line (i.e., the selected column) to store one-bit data. More than one voltage control line may be set to extra HIGH to store one-bit data to a plurality of transistor pairs.

At the time of reading data, one of the word lines WL0 through WL3 is set to HIGH, and one of the voltage control lines GV1 and GV2 may be set to LOW. Further, the latch circuit situated at the selected column (as selected by the LOW state of the corresponding voltage control line) is activated to start a data sensing operation. This latch circuit retrieves data from the transistor pair situated at the intersection between the selected column and the selected row. More than one latch circuit may be activated, and more than one voltage control line may be set to LOW, thereby retrieving one-bit data from a plurality of transistor pairs.

FIG. 16 is a block diagram illustrating an example of the configuration of a nonvolatile semiconductor memory device. A semiconductor memory device shown in FIG. 16 includes an input buffer 101, an output buffer 102, a column decoder 103, a write amplifier 104, a sense amplifier & column selector 105, a mode selector 106, a row decoder 107, a row signal driver 108, and a memory cell array 109.

The memory cell array 109 has the same or similar configuration as the transistor array illustrated in FIG. 15 while the number of n-channel MOSFETs, the number of rows, and the number of columns are determined according to design needs. The nonvolatile memory cell transistors arranged in the same column are connected to the same bit lines and to the same voltage control line, and the nonvolatile memory cell transistors arranged in the same row are connected to the same word line.

The mode selector 106 receives mode input signals from outside the device, and decodes the mode input signal to determine an operation mode (e.g., a write operation mode or a read operation mode). Control signals responsive to the determined operation mode are supplied to the write amplifier 104, the sense amplifier & column selector 105, the row signal driver 108, etc., for control of the individual parts of the semiconductor memory device.

The column decoder 103 receives a column address input from outside the device, and decodes the column address input to determine a selected column. The decode signals indicative of the selected column are supplied to the write amplifier 104 and the sense amplifier & column selector 105.

The row decoder 107 receives a row address input from outside the device, and decodes the row address input to determine a selected row. The decode signals indicative of the selected row are supplied to the row signal driver 108.

In response to the control signals from the mode selector 106 and the decode signals from the row decoder 107, the row signal driver 108 activates a selected word line among the word lines extending from the row signal driver 108. As a result of the activation of the selected word line, the nonvolatile memory cell transistors connected to this word line are turned on. With this arrangement, the writing/reading of data to/from the nonvolatile memory cell transistors is performed.

In response to the control signals from the mode selector 106 and the decode signals from the column decoder 103, the sense amplifier & column selector 105 couples the bit lines corresponding to the selected column to the latch circuits thereof serving as sense amplifiers. Through this coupling, data is transferred between the memory cell array 109 and the latch circuits. The sense amplifier & column selector 105 also controls the voltage level of the voltage control lines. The operations of a given latch circuit and a given transistor pair are the same as or similar to those described in connection with FIG. 14. The sense amplifier & column selector 105 amplifies the data read from the memory cell array 109 for provision to the output buffer 102. The data is output from the output buffer 102 to outside the device as output data. Input data supplied to the input buffer 101 is provided to the write amplifier 104. The write amplifier 104 writes the input data to the latch circuits in the sense amplifier & column selector 105, which then writes the input data to the memory cell array 109.

Further, the present invention is not limited to these embodiments, but various variations and modifications may be made without departing from the scope of the present invention.

What is claimed is:
1. A nonvolatile memory device, comprising;
an input buffer;
a write amplifier being connected to the input buffer;
a sense amplifier being connected to the output buffer;
a column selectors being connected to the sense amplifier;
a latch circuit located in the sense amplifier; and
a plenty of nonvolatile memory cell being connected to the column selectors;
wherein the input buffer outputs an input data to write amplifier, the write amplifier writes the input data to the latch circuits, and the column selector writes the input data to the memory cell array,
wherein the sense amplifier is configured to amplify a difference in drain currents between a first one of the nonvolatile memory cell transistors and a second one of the nonvolatile memory cell transistors;
wherein the plenty of nonvolatile memory cell, each comprising
a first-conductivity-type semiconductor layer;
a metal layer formed in a surface of the first-conductivity-type semiconductor layer;
the metal layer being connected to the column selector;
a second-conductivity-type diffusion layer formed in the surface of the first-conductivity-type semiconductor layer and spaced apart from the metal layer;

an insulating film disposed on the surface of the first-conductivity-type semiconductor layer between the metal layer and the second-conductivity-type diffusion layer;

a gate electrode disposed on the insulating film between the metal layer and the second-conductivity-type diffusion layer; and a sidewall disposed at a same side of the gate electrode as the metal layer and situated between the gate electrode and the metal layer, the sidewall being made of insulating material.

2. The nonvolatile memory device as claimed in claim 1, wherein an end of the metal layer situated toward the second-conductivity-type diffusion layer is aligned with a lower end of an outer lateral face of the sidewall.

3. The nonvolatile memory device as claimed in claim 1, wherein no portion of the metal layer is situated directly below the sidewall.

4. The nonvolatile memory device as claimed in claim 1, wherein the first-conductivity-type semiconductor layer is a p-type silicon substrate, and the second-conductivity-type diffusion layer is an n-type diffusion layer.

5. The nonvolatile memory device as claimed in claim 1, wherein the metal layer is made of a material selected from a group consisting of nickel silicide, cobalt silicide, titanium silicide, and platinum silicide.

6. The nonvolatile memory device as claimed in claim 1, wherein the sidewall includes a silicon nitride film and a silicon oxide film, the silicon oxide film being situated between the silicon nitride film and the first-conductivity-type semiconductor layer.

7. The nonvolatile memory device as claimed in claim 1, further comprising a first-conductivity-type diffusion layer formed in the first-conductivity-type semiconductor layer around the second-conductivity-type diffusion layer, the first-conductivity-type diffusion layer having higher impurity concentration than the first-conductivity-type semiconductor layer.

8. The nonvolatile memory device as claimed in claim 1, wherein a given one of the nonvolatile memory cell transistors has a drain current thereof flowing in a first direction during a data read operation and flowing in a second direction during a data write operation, the first direction and the second direction being opposite to each other.

* * * * *